United States Patent
Brand et al.

(10) Patent No.: US 11,868,289 B2
(45) Date of Patent: Jan. 9, 2024

(54) INPUT/OUTPUT STATION FOR A FIELD BUS SYSTEM, FIELD BUS COUPLER FOR THE INPUT/OUTPUT STATION, AND PLACEHOLDER MODULE FOR THE INPUT/OUTPUT STATION

(71) Applicant: Phoenix Contact GmbH & Co. KG, Blomberg (DE)

(72) Inventors: Klaus Brand, Bad Salzuflen (DE); Jan Pollmann, Steinheim (DE); Frank Mueller, Detmold (DE); Thorsten Matthies, Barntrup (DE); Stefan Pollert, Espelkamp (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 17/763,262

(22) PCT Filed: Sep. 30, 2020

(86) PCT No.: PCT/EP2020/077337
§ 371 (c)(1),
(2) Date: Jul. 5, 2022

(87) PCT Pub. No.: WO2021/064004
PCT Pub. Date: Apr. 8, 2021

(65) Prior Publication Data
US 2022/0334988 A1    Oct. 20, 2022

(30) Foreign Application Priority Data
Oct. 2, 2019  (LU) ........................................ 101427

(51) Int. Cl.
*G06F 13/20* (2006.01)
*H04L 12/40* (2006.01)

(52) U.S. Cl.
CPC .............. *G06F 13/20* (2013.01); *H04L 12/40* (2013.01); *G06F 2213/40* (2013.01); *H04L 2012/4026* (2013.01)

(58) Field of Classification Search
CPC ..... G06F 13/20; G06F 2213/40; H04L 12/40; H04L 2012/4026
See application file for complete search history.

(56) References Cited

U.S. PATENT DOCUMENTS 6,076,952 A * 6/2000 Gretta ................ G05B 19/0426
370/257
8,825,948 B2 * 9/2014 Oner .................... G06F 13/1673
711/E12.001

(Continued)

FOREIGN PATENT DOCUMENTS

EP     0952523 A1    10/1999
EP     2042952 A1    4/2009
(Continued)

*Primary Examiner* — Henry Tsai
*Assistant Examiner* — John B Roche
(74) *Attorney, Agent, or Firm* — LEYDIG, VOIT & MAYER, LTD.

(57) ABSTRACT

An input/output station is provided. The input/output station is for a fieldbus system with a fieldbus coupler, which has a system bus interface and a fieldbus interface. The input/output station comprising a plurality of slots for pluggable input/output devices. One or more placeholder devices are also pluggable into the plurality of slots besides the input/output devices. An empty slot is also admissible for the plurality of slots. The fieldbus coupler comprises firmware which is configured for a full configuration of the input/output station. The firmware is configured to communicate with a control station in such a way that the fieldbus coupler receives the full configuration of the input/output station as a planned target configuration from the control station. The firmware is configured to confirm a full configuration of the (Continued)

input/output station in an operating mode irrespective of the actual occupancy of the input/output station.

13 Claims, 4 Drawing Sheets

(56) References Cited

U.S. PATENT DOCUMENTS

| | | | | |
|---|---|---|---|---|
| 8,938,376 | B2* | 1/2015 | Hollis | G06F 30/367 |
| | | | | 703/2 |
| 2008/0140888 | A1* | 6/2008 | Blair | G05B 19/054 |
| | | | | 710/104 |
| 2009/0265020 | A1* | 10/2009 | Blair | G05B 19/054 |
| | | | | 700/19 |
| 2011/0060855 | A1 | 3/2011 | Kuschke et al. | |
| 2014/0045538 | A1* | 2/2014 | Sinclair | H04W 68/04 |
| | | | | 455/458 |
| 2021/0103546 | A1* | 4/2021 | Wessling | G06F 13/387 |

FOREIGN PATENT DOCUMENTS

| | | |
|---|---|---|
| WO | WO 2007121968 A2 | 11/2007 |
| WO | WO 2007149688 A2 | 12/2007 |
| WO | WO 2015036567 A1 | 3/2015 |

\* cited by examiner

US 11,868,289 B2

INPUT/OUTPUT STATION FOR A FIELD BUS SYSTEM, FIELD BUS COUPLER FOR THE INPUT/OUTPUT STATION, AND PLACEHOLDER MODULE FOR THE INPUT/OUTPUT STATION

CROSS-REFERENCE TO PRIOR APPLICATIONS

This application is a U.S. National Phase application under 35 U.S.C. § 371 of International Application No. PCT/EP2020/077337, filed on Sep. 30, 2020, and claims benefit to Luxembourg Patent Application No. LU 101427, filed on Oct. 2, 2019. The International Application was published in German on Apr. 8, 2021 as WO/2021/064004 under PCT Article 21(2).

FIELD

The present invention relates to an input/output station for a fieldbus system, which can be used, for example, to acquire data and to control machines and systems, as well as to a correspondingly designed fieldbus coupler and a corresponding placeholder module for the input/output station.

BACKGROUND

Communication systems of this type, such as input/output (I/O) stations, are frequently used in production plants because their modular design allows a wide range of applications in the production process. A communication system of this type features in particular a processor, a configuration memory, one or more pluggable input and/or output modules (I/O modules) and an internal bus system. The I/O module or modules here form an interface via which process data and control data, such as sensor signals and actuator signals, may be sent to and received from devices to be controlled. The bus system comprises, for example, a system bus with a data bus as well as a memory address bus for process data exchange between the processor and the I/O module, a control bus, and an address bus also referred to as a peripheral selection bus. Each I/O module has a unique address by which it may be selected via the address bus. A communication system of this type is known, for example, from EP 0 952 523 A1.

In another embodiment, the communication system includes a bus coupler and an internal bus system with integrated bus subscribers, as described in EP 2 274 655 A1. The bus subscribers are, in particular, I/O modules.

I/O stations may be designed in different versions. These are, on the one hand, a full station configuration, i.e. the largest station configuration in which all slots of an I/O station are equipped with function-enabled I/O modules, and, on the other hand, variants of the I/O station in which one or more of the function-enabled I/O modules are not installed and slots of the I/O station are therefore empty. The sequence and the respective type of the plugged I/O modules are identical in the different versions.

According to the state of the art, a project or a sub-project must be created in the project planning or engineering program for each of these different versions of an I/O station so that the target configuration of the I/O station matches the actual configuration. If the I/O station is extended with one or more additional I/O modules, the project planning program is then supplemented by another project with the corresponding functionality.

This implies a considerable effort for an I/O station already installed in a producing plant section or machine, which may lead to long downtimes. Furthermore, the expansion of a system involves technical risks, since signal runtimes may change as a result of the expansion. The result is high costs for retrofitting together with a technical risk that is difficult to estimate.

The document EP 2 042 952 A1 teaches a communication system of this type referred to as a switchgear controller, which comprises a processor, a memory for current or applicable configurations and at least one switchgear communication interface. Here, the switchgear controller is capable of identifying a peripheral address as being not populated and storing it in the memory for the current or applicable configurations, reserving the address for a non-populated device. To avoid an empty slot, a physical placeholder module may be used here to occupy the slot instead of a function-enabled I/O module, and the address of the unused I/O module is assigned to it.

The document WO 2007/121968 A2 teaches a plug-in module for a communication interface in the fieldbus area, which contains a function of a programmable logic controller (PLC). The communication interface has an internal control function that acts on communication data as if the control function were implemented in another device.

SUMMARY

In an embodiment, the present invention provides an input/output station for a fieldbus system with a fieldbus coupler, which has a system bus interface and a fieldbus interface, the input/output station comprising a plurality of slots for pluggable input/output devices, wherein one or more placeholder devices are also pluggable into the plurality of slots besides the input/output devices, wherein an empty slot is also admissible for the plurality of slots, wherein the fieldbus coupler comprises firmware which is configured for a full configuration of the input/output station, wherein the firmware is configured to communicate with a control station in such a way that the fieldbus coupler receives the full configuration of the input/output station as a planned target configuration from the control station, and in that the firmware is configured to confirm a full configuration of the input/output station in an operating mode irrespective of the actual occupancy of the input/output station with the pluggable input/output devices of the control station.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
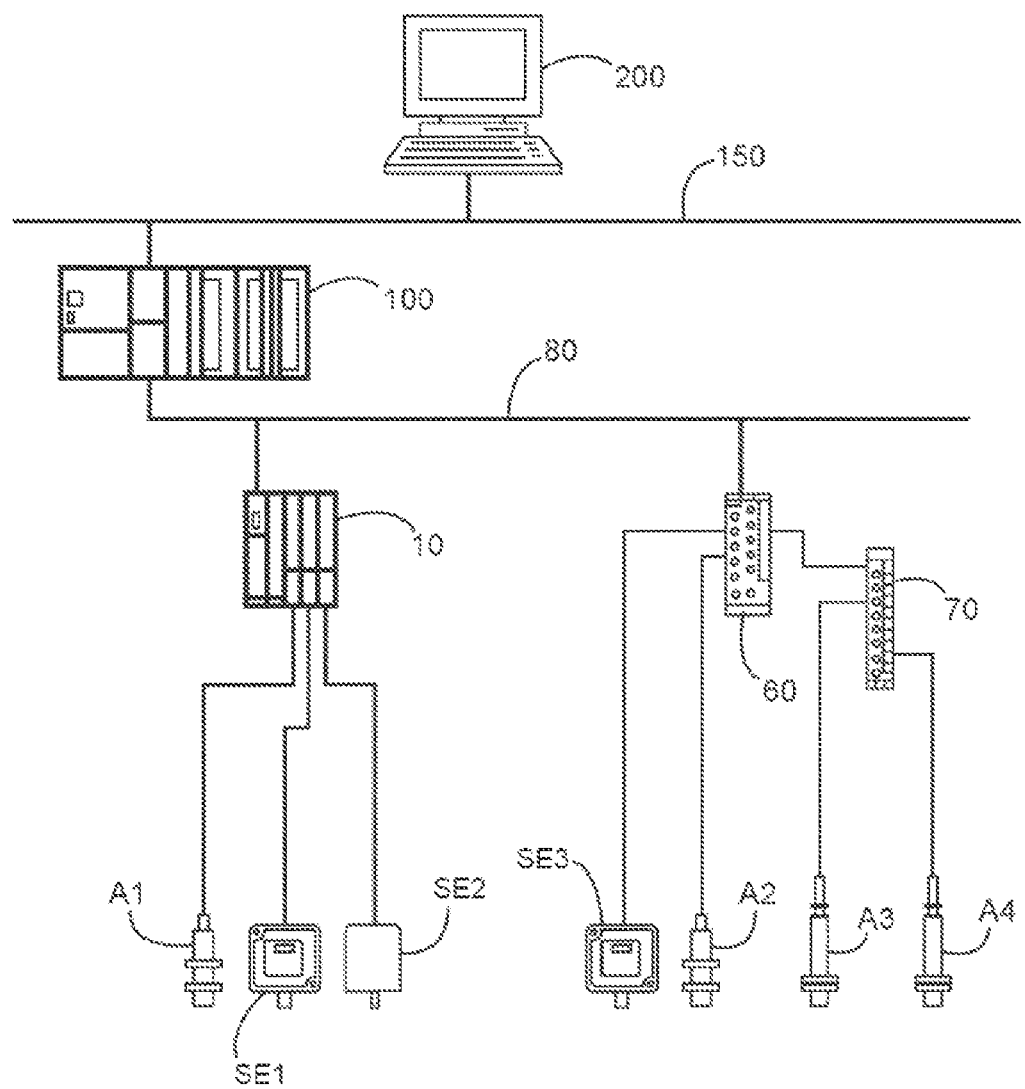
FIG. 1 shows a system overview of a machine or plant control system with a fieldbus system according to the state of the art.

In some embodiments, the present invention reduces the effort for project planning for a communication system by using an input/output station for a fieldbus system, a fieldbus coupler for an input/output station, and/or a placeholder module for an input/output station.

In one embodiment, the present invention provides an input/output station for a fieldbus system with a fieldbus coupler which has a system bus interface, and a fieldbus interface with corresponding firmware, the input/output station having a number of slots for pluggable input/output modules into which, in addition to a number of input/output modules, at least one placeholder module is plugged. A special feature is that the fieldbus coupler contains a firmware which is adapted for a full configuration of the input/output station, wherein the firmware for communication with a control station is adapted in such a way that it receives the full configuration of the input/output station from the control station as a projected (or configured or planned) target configuration, and that the firmware confirms the full configuration of the input/output station in an operating mode independently of the actual occupancy of the input/output station with input/output modules of the control station. The advantage of this present invention is that it is no longer necessary for the different versions of the input/output station to create a separate project (i.e. more than one project) in the project planning or engineering software for each station version so that the target configuration of the input/output station matches the actual configuration. This means that only one project needs to be created in the project planning or engineering software for the different versions of an input/output station, thus reducing the project planning and administration work for the customer, i.e. the machine or plant manufacturer.

The present invention also provides advantages for the control program. An optional extension of a machine or plant section, such as in a production plant, may already be provided at the initial commissioning of the control program. If an extension is then to be integrated into the production plant, only the corresponding control part in the control program must be enabled (or cleared) for use and the placeholder modules exchanged for the function-enabled I/O modules provided for this purpose.

An extension of the solution is that the firmware is designed in such a way that the operating mode can be switched on and off with confirmation of the full extension of the input/output station via a parameter created in the firmware, which may be set or removed remotely by configuration software running on a configuration computer. This form of firmware design achieves backward compatibility so that this firmware may also adopt (or apply) the behavior of the previous firmware when the additional operating mode is switched off by setting the parameter accordingly.

The present invention further provides advantages if dummy data for the at least one placeholder module is inserted or dummy data for the at least one placeholder module is received from the control station in a communication cycle with the control station. This has the advantage that the bus functionality of the full expansion stage is simulated in this form and there is no change in the bus cycle times on the fieldbus when a placeholder module is replaced. In the case of the intelligent placeholder module, even the cycle time of the system bus would remain constant, since the placeholder module has the process data width of the module that is otherwise provided on the respective slot.

Another advantageous feature of the present invention is that a placeholder module has a preconfigured memory in which a default configuration is stored with a default setting for the placeholder module.

For internal communication in the I/O station, it is advantageous if the firmware of the fieldbus coupler communicates with the I/O modules of the I/O station via the system bus with a reduced process data width in the operating mode with confirmation of full configuration, in which operating mode the reduction of the process data width corresponds to the number of data scheduled per communication cycle for the unoccupied I/O modules. The fieldbus coupler communicates with the input/output modules via the system bus of the input/output station with reduced process data width, since it applies that the process data width of the actual configuration<process data width of the target configuration. This applies to an unoccupied slot or a slot in which a placeholder module with process data width=0 is plugged.

In another variant, in which the firmware of the fieldbus coupler in the operating mode with confirmation of the full configuration communicates with the input/output modules of the input/output station via the system bus in full process data width, it is necessary that so-called intelligent placeholder modules are plugged into the empty slots. For such a placeholder module it is advantageous that the intelligent placeholder module is adapted to transmit simulated process data via the system bus to the fieldbus coupler and to receive simulated process data from the fieldbus coupler per internal communication cycle. This has the great advantage that the timing on the system bus already corresponds to the timing of the full expansion of the input/output station during the planned initial installation without full occupancy of the input/output station.

In another variation, it is advantageous that the fieldbus coupler firmware is adapted to insert dummy data for the at least one inserted placeholder module and/or receive dummy data for the at least one placeholder module (37-39) from the control station (100) in a communication cycle for exchanging data with the control station. This also has timing advantages. In that case, however, it is a matter of timing on the fieldbus when communicating with the control station, which may be implemented as a PLC (programmable logic controller), for example. The fieldbus timing is then already maintained during the planned initial installation without full occupancy of the input/output station, and it no longer changes due to the later full expansion.

In a particularly simple variant, the fieldbus coupler receives zeros from the control station as dummy data for the corresponding placeholder module for a projected (or configured or planned) analog output module, which is however replaced by a placeholder module, but does not forward these to the placeholder module via the system bus of the input/output station. The same may be done for an empty space in the I/O station if no placeholder module is plugged.

In the same way, it is advantageous that the fieldbus coupler for a projected (or configured or planned) analog input module, which is replaced by a placeholder module, sends zeros as dummy data for the placeholder module to the control station. This way the bus functionality is obtained and does not change when the placeholder module is replaced by a functional input/output module. The same may be done for an empty place in the I/O station if no placeholder module is plugged.

The corresponding advantageous measures may be achieved for fieldbus couplers, which are adapted accordingly. In a first embodiment, the invention comprises a fieldbus coupler which includes firmware which is adapted for a full configuration of the input/output station, the firmware being adapted for communication with a control station in such a way that it receives the full configuration of the input/output station from the control station as a projected (or configured or planned) target configuration, and that the firmware confirms the full configuration of the input/output station in an operating mode independent of the actual occupancy of the input/output station with input/output modules of the control station.

In another embodiment of the invention, there is provided a placeholder module for an I/O station, characterized in that the at least one plugged-in placeholder module comprises at least one non-volatile memory, and optionally a microcontroller, and there is provided that either the memory or the microcontroller is adapted to send the simulated process data to the fieldbus coupler via the system bus and to receive simulated process data from the fieldbus coupler.

The present description illustrates the principles of the disclosure according to the invention. It is thus understood that those skilled in the art will be able to conceive various embodiments which, although not explicitly described herein, embody principles of the disclosure according to the invention and are also intended to be protected in scope.

FIG. 1 shows a system overview for a machine or plant control based on the use of a fieldbus system. The fieldbus is designated by the reference number 80. This fieldbus is connected to the machine or plant control 100. This control 100 is typically placed at the factory (or manufacturing) floor. It corresponds to an industrial PC, which is often implemented as a PLC, i.e. a programmable logic controller. The control programs are transmitted to the control 100 via another network 150, which may, for example, be designed as an Ethernet network, in particular an Industrial Ethernet network. The development of the control programs, which are processed by the control 100, typically takes place away from the factory floor in an office complex. Reference numeral 200 designates a project engineering computer. The software engineer uses this project planning computer 200 to develop the control programs. Via the network 150, the finished control programs are transmitted to the control 100. The various process or plant data are transmitted to the control 100 via the fieldbus 80. Conversely, the various control data are transmitted from the control 100 to the corresponding machine or plant parts. So-called input/output stations 10 are connected to the fieldbus 80 for this purpose. These are equipped with a fieldbus coupler and with various input/output modules, to which in turn the various sensors SE1, SE2 and actuators A1 are connected. FIG. 1 further shows a separate input/output unit 60, which is not modular. A sensor SE3 and an actuator A2 are connected to it. Also connected to it is a switching unit 70 to which further actuators A3, A4 are connected.

Figure 2:
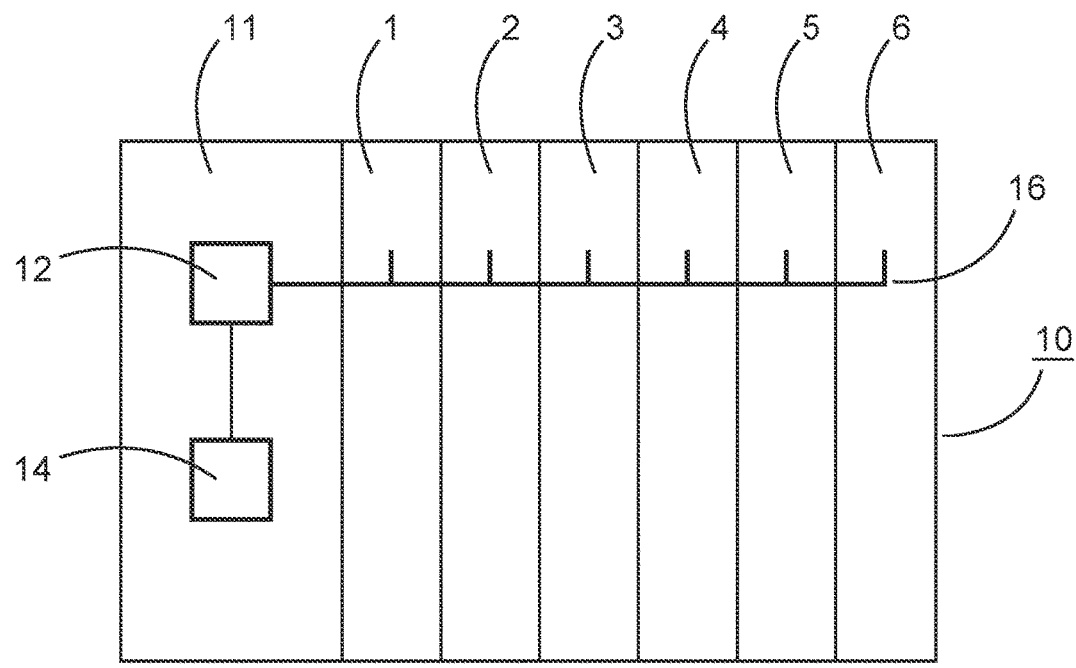
FIG. 2 shows an input/output station of a fieldbus system according to the state of the art.

FIG. 2 schematically shows the prior art input/output station 10, which in a full embodiment has six pluggable input and/or output modules (I/O modules) 1-6, and a fieldbus coupler 11. The fieldbus coupler 11 includes a fieldbus interface 14 and a system bus interface 12 that is connected to the internal system bus 16. The various I/O modules 1-6 are also connected to the system bus 16.

Each of the I/O modules 1-6 forms an interface via which process or machine or plant data such as sensor data may be received from them and control data may be sent to devices such as actuators to be controlled. The I/O modules 1-6 each have a unique address via which the I/O modules 1-6 may be selected by the system bus interface 22 via the system bus 16 to send the output data or receive the input data.

If further functions are to be integrated into the input/output station 10, further I/O modules must be inserted into the communication system 10 in order to integrate the newly added sensor and actuator data into the input/output cycle of the input/output station 10. For example, the new I/O modules contain analog inputs and outputs or digital inputs and outputs with corresponding functions. Where analog sensor signals are present, these are digitized and then forwarded in the form of digital data. The addition of additional I/O modules must accordingly also be extended by this functionality in the control program of the control station 100. This is related to considerable effort, in particular also project planning effort.

Figure 3:
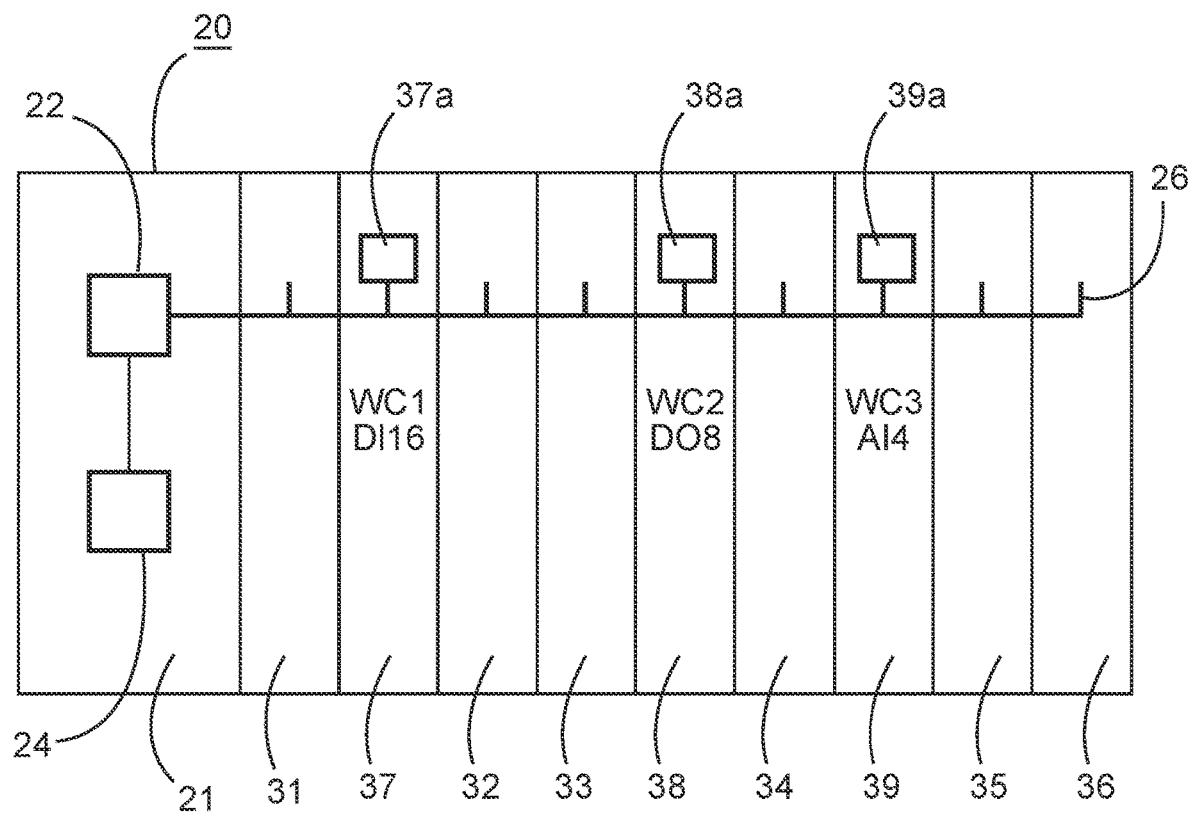
FIG. 3 shows a first preferred embodiment of an input/output station of the fieldbus system according to the invention.

A preferred first embodiment of an input/output station 20 according to the invention is schematically shown in FIG. 3. The input/output station 20 includes a fieldbus coupler 21 with a fieldbus interface 24 and a system bus interface 26, via which the fieldbus interface 22 is connected to a plurality of I/O modules. In the embodiment of FIG. 3, the input/output station 20 has a configuration level with six function-enabled I/O modules 31-36 and three functionless placeholder modules 37-39, referred to as "wild card" modules (WC1-WC3) in FIG. 2. Each of the wild card modules 37-39 includes at least one preconfigured memory 37a-39a and optionally a microcontroller, each of which stores a default configuration, and each of the wild card modules 37-39 is connected to the system bus interface 22 via the internal system bus 26.

When projecting (or configuring or planning) the control program for the control station 100, a full configuration of the input/output station 20 with nine functional I/O modules 31-39 is projected (or configured or planned) from the outset. The control program then also has the corresponding program parts for the functional I/O modules, which are, however, still occupied by placeholder modules.

The input/output station 20 with the six I/O modules 31-36 is, for example, capable of controlling a machine or plant section. If this machine or plant section is to be expanded at a later time, one, two or all three of the placeholder modules 37-39 are replaced by function-enabled I/O modules, for example by the DI16, DO8 and AI4 modules. Here, the abbreviations DI stand for "Digital In", DO for "Digital Out", and AI for "Analog In". Since in principle the functions of reading in digital data or analog signals and the output of digital data are concerned, these functions may be configured with the corresponding default configurations in such a way that the bus functionalities are not changed by the replacement by functional modules. In particular, this may be implemented in such a way that the fieldbus coupler 21 and the fieldbus coupler in the control station 100 already assume the full configuration of the input/output station 100 during the transmission cycles and insert simulated input/output data for the placeholder modules 37-39.

Already during the project engineering (or project planning) with the project engineering computer 200 the full extension is assumed. The configuration program has only one project and is therefore already adapted for all possible expansion versions from a minimum expansion version with one I/O module up to a full expansion with nine I/O modules. When commissioning (or deploying) a new expansion stage (or configuration level), it is therefore not necessary to change the project planning program.

The placeholder modules 37-39 are equipped with at least one preconfigured memory and optionally a microcontroller, wherein, for example, the memory is already provided with a specific default configuration during manufacture. A default configuration here describes in particular the functionality of an I/O module that is to replace the corresponding placeholder module 37, 38 or 39 at a later time. The control program that is processed in the control station 100 for the input/output station 20 is here in particular already adapted for the full configuration with nine function-enabled I/O modules, in that the control program already contains the input/output functionalities of the modules DI16, DO8 and AI4. If one or more of the placeholder modules 37-39 is later replaced by a corresponding I/O module intended for this purpose, the control program recognizes this by the fact that input data other than the simulated data of the default configuration is now supplied and automatically puts this into operation.

In particular, the placeholder modules 37-39 each contain the identical bus functionalities as the function-enabled I/O modules to be used at a later time, in this embodiment the I/O modules DI16, DO8 and AI4. Thus, in the event of a later upgrade by adding intended optional machine or system components, there is no change in the system runtime when the control program is executed via the communication system 20.

Figure 4:
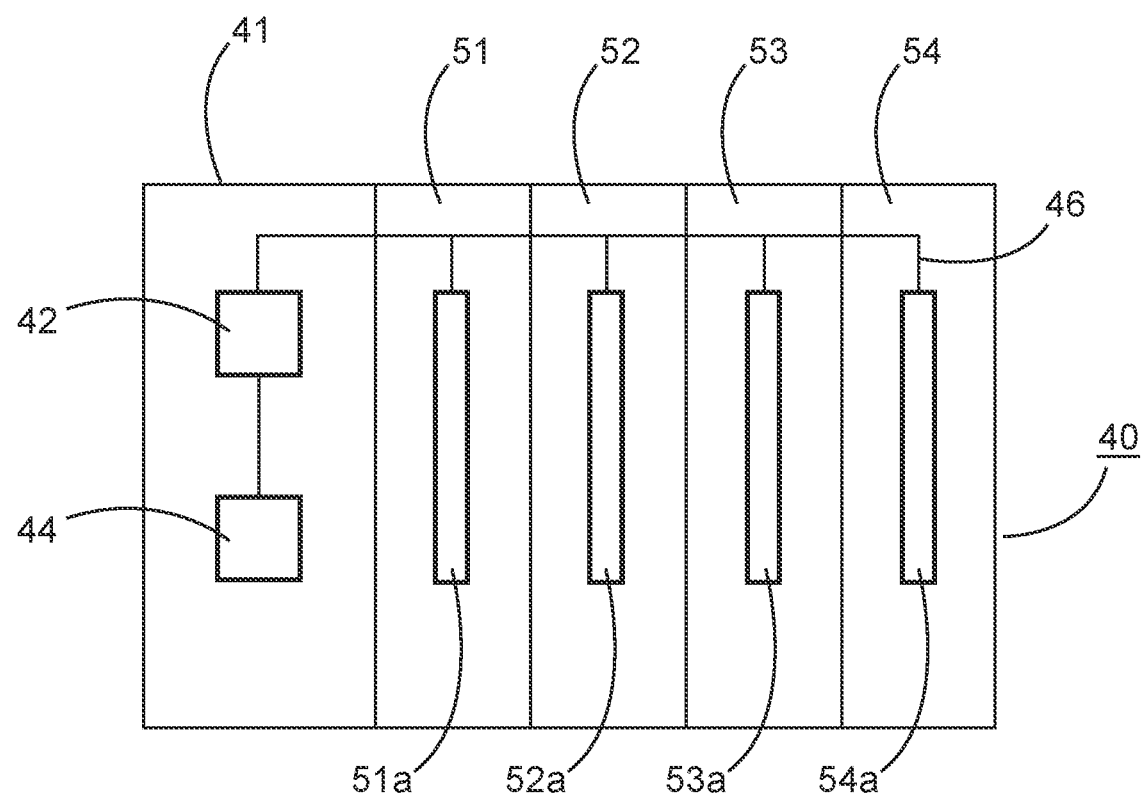
FIG. 4 shows a second preferred embodiment of an input/output station of the fieldbus system according to the invention.

In another preferred embodiment of the invention, shown schematically in FIG. 4, an I/O station 40 includes a system bus interface 42, a fieldbus coupler 44 and an internal bus system 46 (system bus), as well as four slots 51-54 for I/O modules. The four slots 51-54 each have a plug-in connector 51a-54a through which a plugged-in I/O module is connected to the internal bus system 46.

The firmware for the bus coupler 41 is adapted, in this case, for a full expansion with four function-enabled I/O modules, wherein the following four I/O modules may be used: digital input module, digital output module, analog input module or analog output module. Permissible configurations for the four slots 51-54 are:

1.) Digital input module, digital output module, analog input module, analog output module, corresponding to a full expansion (or full configuration).

2.) Digital input module, digital output module, analog input module, placeholder module.

3.) Digital input module, digital output module, placeholder module, analog output module.

4.) Digital input module, digital output module, placeholder module, placeholder module, corresponding to a minimum degree of expansion (or minimum configuration).

Figure 5:
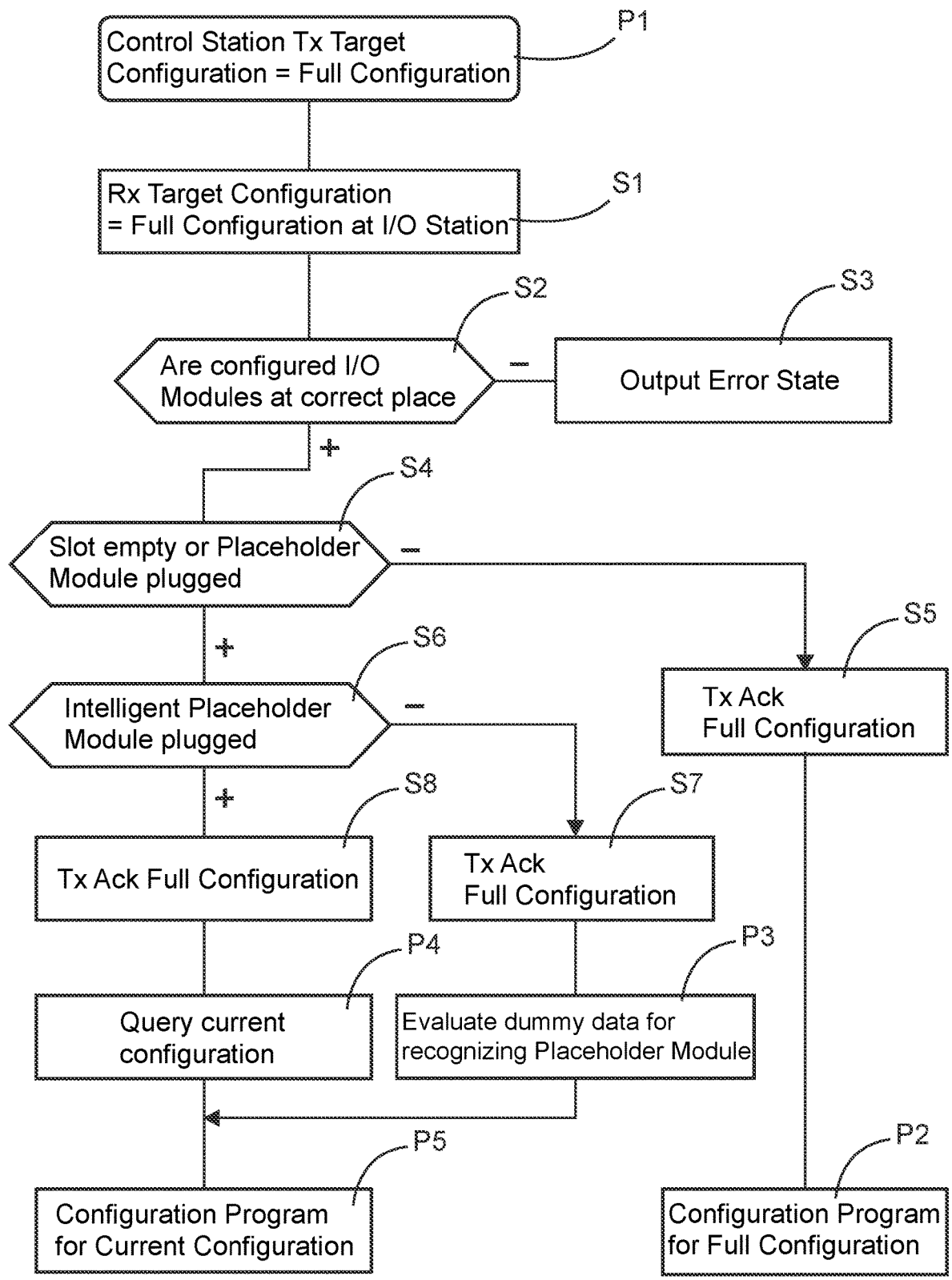
FIG. 5 shows a flow chart illustrating the interaction of the firmware in the fieldbus coupler with the projecting (or configuring or planning) software.

In the following, the behavior of the firmware of the fieldbus coupler is explained with the help of the flow chart in FIG. 5. The firmware is adapted for a plurality of variants. In step P1, the configuration software running on the configuration computer 200 sends a target configuration to the control station 100 for preparation. This forwards the target configuration to the input/output station 20, 40. The full configuration is specified to the input/output station 40 as the target configuration. This is also done if the machine or system builder uses an input/output station 20, 40 in his project that is not fully occupied with input/output modules 31-39. The reason for this is that the machine or system builder only has to create one project for all configurations and thus the project planning and administration effort for the machine or system builder is lower. In step S1, the specification of the target configuration is sent to the fieldbus coupler 21, 41. The firmware of the fieldbus coupler 21, 41 then checks whether the specified target configuration is actually present in the input/output station 20, 40. First of all, in step S2, it checks whether the input/output modules 31-39 configured by the target configuration are plugged into the projected (or configured or planned) position (or place) in the input/output station 20, 40. This corresponds to a typical procedure in the firmware of bus couplers for input/output stations 20, 40. The check is based on the fact that functional input/output modules 31-36 are provided with an identification which is queried in this step. The target configuration lists the identifications of the input/output modules 31-39 plugged when fully extended. If this check determines that an input/output module other than the configured modules is plugged, or that a configured module is plugged into a slot other than the intended slot, an error message is returned to the control station 100 in step S3. This will then be forwarded to the configuration computer 200. At the same time, it may be provided that an error lamp is caused to light at the input/output station 20, 40. If the input/output station 40 is equipped with an alphanumeric/graphic display unit, the error message may also be output there in text form.

If no incorrect assignment (or occupancy) has been detected, a check is made in step S4 to determine whether a placeholder module (37-39) is plugged into the input/output station 20, 40 or alternatively whether an unassigned slot is present. For the second case, however, the input/output station 20, 40 must be adapted in such a way that the fieldbus coupler (21, 41) detects that a slot 51a-54a is unoccupied. The detection of an empty slot is currently done by means of the fieldbus coupler firmware. Alternatively, this may be achieved by simple circuitry measures. For this, it is already sufficient that one contact per slot is closed or opened when an input/output module 31-39 is plugged in, wherein these contacts are monitored by the fieldbus coupler (21, 41).

If no empty slot or placeholder module was detected, the fieldbus coupler (21, 41) assumes that the full configuration is present and the firmware branches to step S5 where a message with a confirmation of the full configuration is sent back to the control station 100. This is forwarded to the configuration computer 200, which processes the configuration program with all program parts for all input/output modules 31-39 according to the full configuration in step P2.

If the test in step S4 determines that there is an empty slot 51a-54a or a placeholder module 37-39, another test follows in step S6. This check refers to testing whether an intelligent placeholder module (37-39) is plugged into a slot 51a-54a. This may be recognized by the fact that the identification of the placeholder module (37-39) is requested. In this respect, an intelligent placeholder module (37-39) reacts in the same way as a functional input/output module 31-39. If no intelligent placeholder module has been detected, the message is also sent back to the control station 100 in step S7 with a confirmation of full configuration. If now an intelligent placeholder module was detected, in step S8 also the message with a confirmation of the full configuration (or full extension) is sent back to the control station 100. The firmware of the fieldbus coupler 21, 41 then starts inserting dummy data into the communication cycle for communication with the control station in both cases, i.e. after steps S7 and S8. In the case where no intelligent dummy module (37-39) is plugged in, i.e., after step S8, fixed data such as zeros may be inserted as process data in one variant. In another improved variant, which is possible with intelligent placeholder modules, coded dummy data is inserted. By these e.g. the type of the intelligent placeholder module (37-39) can be recognized in the configuration software.

Steps S1 to S8 show the behavior of the firmware on the side of the fieldbus coupler (21, 41). On the side of the configuration software running on the configuration computer 200, steps follow which are also shown in FIG. 5. In step P3, it is checked whether coded dummy data are entered in the communication cycle for communication with the control station 100. If so, these are evaluated in the step P3. In this way, the configuration software may recognize intelligent dummy modules (37-39) without itself sending a request to the input/output station 20, 40. If the information about the plugged placeholder modules (37-39) could be obtained in this way, the configuration software itself may decide which program parts must be omitted for the unplugged input/output modules. If no intelligent placeholder module is plugged, this information is obtained in step P4 by sending a conventional query of the actual (or current) configuration to the input/output station 20, 40. With input of the report on the actual (or current) configuration, the corresponding program parts for the slots not occupied by functional input/output modules 31-39 may also be suppressed.

The placeholder modules for the input/output station 40 preferably have a process data width of zero bytes. If the input/output station 40 has, for example, the specification 4.) with two placeholder modules, the system bus interface 42 communicates with the existing I/O modules with reduced process data width during the execution of the control program in the control station 100, since the process data width of the actual configuration is smaller than the process data width of the full configuration.

Dummy data is sent to the fieldbus coupler 41 for the projected (or configured or planned) analog output module, in a slot of which one of the placeholder modules is still plugged. The fieldbus coupler 41 removes the process data for the analog output module because this is not installed or plugged behind the fieldbus coupler 41 but instead the dummy module with process data width zero. For the configured but not installed or not plugged analog input module, the fieldbus coupler 41 sends dummy data to the control station 100; but since the program section for the analog input module is not run through (or executed) there, the dummy data is recognized and not forwarded to the program section for this I/O module at all. It may be defined very variably which dummy data are used for this. In the simplest case "zeros" may be sent as dummy data.

For I/O stations with protection class IP20, wherein the I/O modules are plugged into slots of a base carrier, unused slots must be provided with an appropriate cover for protection against ESD, dust, etc. If a placeholder module is plugged, this protection is given (or achieved). However, this is not the case with open empty slots. To avoid this, a slot cover may be used. The absence of such a cover may go unnoticed and may cause the input/output station to malfunction or fail during operation, which in turn may cause the machine or system to come to a standstill. Here it is necessary to find a solution with which the absence of this cover is automatically detected and indicated.

One solution is based on the fact that the cover includes electronics based on which the cover can be identified as such. An embodiment of this solution consists of an I/O station 10 comprising a fieldbus coupler 21, 41 and a base carrier with a number of slots 51a to 54a for I/O modules 31 to 39. Like the placeholder module with process data width zero, the slot cover is equipped with a non-volatile memory, which is configured as an EEPROM, for example. This configuration is configured in a project planning or engineering software using the corresponding device description files (e.g. GSDML for Profinet). A corresponding device description file also exists for this type of slot cover. If the cover is missing, a corresponding error message or a corresponding (warning) note (or indication) is indicated (or displayed) in the projecting (or configuring or planning) or engineering software.

The EEPROM may be programmed with a unique object with an ID code, e.g. device type code. This programmed device type code may be evaluated by the fieldbus coupler 21, 41 of the input/output station 10. If EEPORM is missing or if the object with device type code is missing, a warning e.g. "Slot not covered" or "ESD protection not plugged—backplane x slot y" including indication of the affected slot (incl. location e.g. backplane 3 slot 5) is sent.

It should be understood that the proposed communication system may be implemented in various forms of hardware, software, firmware, and with special processors or a combination thereof. In a preferred embodiment, microcontrollers with integrated RAM memory and corresponding I/O interfaces for processors 22 and 42 are used. In particular, non-volatile programmable memories are used for memories 37a-39a. The memories 24 and 44 may have a volatile or non-volatile structure and may already be integrated in the processor 22 and 42, respectively. In particular, the processors 22 and 42 may also comprise application specific integrated circuits (ASICs), reduced instruction set computers (RISC) and/or field programmable gate arrays (FPGAs). Preferably, the proposed communication system is implemented as a combination of hardware and software. Preferably, the software is installed as an operating program on one or more non-volatile memories within the communication system 20 or 40.

The disclosure is not limited to the embodiments described herein. There is room for various adaptations and modifications that the person skilled in the art would consider, based on his knowledge of the art, as also pertaining to the disclosure.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A,

LIST OF REFERENCE NUMERALS

Pluggable input/output modules 1-6
First input/output station 10
First fieldbus coupler 11
First system bus interface 12
First fieldbus interface 14
First system bus 16
Second input/output station 20
Second system bus interface 27
Second fieldbus coupler 21
Second fieldbus interface 24
Second system bus 26
Second pluggable input/output modules 31-36
Place holder modules 37-39
Third input/output station 40
Third system bus interface 42
Third fieldbus coupler 41
Third fieldbus interface 44
Third system bus 46
Slots 51-54
Plug connections 51a-54a
input/output unit 60
Switching unit 70
Fieldbus 80
Control station 100
Network 150
Projecting (of configuring or planning) computer 200
First sensor SE1
Second sensor SE2
Third sensor SE3
First actuator A1
Second actuator A2
Third actuator A3
Fourth actuator A4
Different steps in the project engineering program P1-P5
Different steps of the fieldbus coupler firmware S1-S8

The invention claimed is:

1. An input/output station for a fieldbus system with a fieldbus coupler, which has a system bus interface to a system bus and a fieldbus interface, the input/output station comprising:
a plurality of slots to the system bus for pluggable input/output devices, one or more placeholder devices being pluggable into the plurality of slots besides the input/output devices,
wherein an empty slot is admissible for the plurality of slots,
wherein the fieldbus coupler comprises firmware which is configured for a full configuration of the input/output station,
wherein the firmware is configured to communicate with a control station in such a way that the fieldbus coupler receives the full configuration of the input/output station as a planned target configuration from the control station, and
wherein the firmware is configured to confirm the full configuration of the input/output station in an operating mode irrespective of the actual occupancy of the input/output station with the pluggable input/output devices of the control station.

2. The input/output station according to claim 1, wherein the firmware of the fieldbus coupler is configured such that the operating mode with confirmation of the full configuration of the input/output station is switchable on and off via a parameter included in the firmware, and wherein the parameter is set or removed remotely by a planning software running on a planning computer.

3. The input/output station according to claim 1, wherein the firmware of the fieldbus coupler is configured to communicate with the input/output devices of the input/output station via a system bus with a reduced process data width in the operating mode with confirmation of the full configuration, and
wherein the reduction of the process data width corresponds to the number of data scheduled per communication cycle for the unoccupied input/output modules.

4. The input/output station according to claim 1, wherein the firmware of the fieldbus coupler is configured to communicate with the input/output modules of the input/output station via a system bus in full process data width in the operating mode with confirmation of full configuration, and
wherein the one or more plugged-in placeholder devices are configured to transmit simulated process data to the fieldbus coupler via the system bus and to receive simulated process data from the fieldbus coupler per internal communication cycle.

5. The input/output station according to claim 4, wherein the firmware of the fieldbus coupler is configured to insert the dummy data for the one or more plugged-in placeholder devices and/or to receive dummy data for the one or more placeholder devices from the control station in a communication cycle with the control station.

6. The input/output station according to claim 5, wherein the firmware is configured to insert as dummy data a placeholder type code for the one or more inserted placeholder devices in the communication cycle with the control station.

7. The input/output station according to claim 4, wherein the firmware of the fieldbus coupler is configured to receive dummy data for a planned analog output device replaced by a placeholder device from the control station for the corresponding placeholder device, but not to forward the dummy data to the placeholder device via the system bus.

8. The input/output station according to claim 4, wherein the firmware of the fieldbus coupler, for a planned analog input device replaced by a placeholder device, sends dummy data for the placeholder device to the control station.

9. The input/output station according to claim 4, wherein the one or more plugged-in placeholder devices comprises at least one non-volatile memory and a microcontroller, which are configured to send the simulated process data to the fieldbus coupler via the system bus and to receive simulated process data from the fieldbus coupler.

10. The fieldbus coupler for an input/output station according to claim 1, wherein the fieldbus coupler is provided with the firmware.

11. A placeholder device for the input/output station according to claim 1, wherein the placeholder device comprises at least one non-volatile memory and a microcontroller, which are configured to send the simulated process data to the fieldbus coupler via the system bus and to receive simulated process data from the fieldbus coupler.

12. An input/output station for a fieldbus system with a fieldbus coupler, which has a system bus interface and a fieldbus interface, the input/output station comprising:
a plurality of slots for pluggable input/output devices, one or more placeholder devices being pluggable into the plurality of slots besides the input/output devices,
wherein an empty slot is admissible for the plurality of slots, wherein the fieldbus coupler comprises firmware which is configured for a full configuration of the input/output station, wherein the firmware is configured to communicate with a control station in such a way that the fieldbus coupler receives the full configuration of the input/output station as a planned target configuration from the control station, wherein the firmware is configured to confirm the full configuration of the input/output station in an operating mode irrespective of the actual occupancy of the input/output station with the pluggable input/output devices of the control station, wherein the firmware of the fieldbus coupler is configured to communicate with the input/output devices of the input/output station via a system bus with a reduced process data width in the operating mode with confirmation of the full configuration, and wherein the reduction of the process data width corresponds to the number of data scheduled per communication cycle for the unoccupied input/output modules.

13. An input/output station for a fieldbus system with a fieldbus coupler, which has a system bus interface and a fieldbus interface, the input/output station comprising:

a plurality of slots for pluggable input/output devices, one or more placeholder devices being pluggable into the plurality of slots besides the input/output devices, wherein an empty slot is admissible for the plurality of slots, wherein the fieldbus coupler comprises firmware which is configured for a full configuration of the input/output station, wherein the firmware is configured to communicate with a control station in such a way that the fieldbus coupler receives the full configuration of the input/output station as a planned target configuration from the control station, wherein the firmware is configured to confirm the full configuration of the input/output station in an operating mode irrespective of the actual occupancy of the input/output station with the pluggable input/output devices of the control station, wherein the firmware of the fieldbus coupler is configured to communicate with the input/output modules of the input/output station via a system bus in full process data width in the operating mode with confirmation of full configuration, and wherein the one or more plugged-in placeholder devices are configured to transmit simulated process data to the fieldbus coupler via the system bus and to receive simulated process data from the fieldbus coupler per internal communication cycle.

* * * * *